United States Patent
Li et al.

(10) Patent No.: US 11,057,988 B2
(45) Date of Patent: Jul. 6, 2021

(54) ELECTROSTATIC PROTECTION CIRCUIT, CIRCUIT BOARD, AND ELECTROSTATIC PROTECTING METHOD

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Pengtao Li, Beijing (CN); Ying Liu, Beijing (CN); Yangbing Yu, Beijing (CN); Jie Yu, Beijing (CN); Qin Tan, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 377 days.

(21) Appl. No.: 16/089,201

(22) PCT Filed: Mar. 26, 2018

(86) PCT No.: PCT/CN2018/080449
§ 371 (c)(1),
(2) Date: Sep. 27, 2018

(87) PCT Pub. No.: WO2018/177238
PCT Pub. Date: Oct. 4, 2018

(65) Prior Publication Data
US 2020/0305273 A1    Sep. 24, 2020

(30) Foreign Application Priority Data

Apr. 1, 2017  (CN) .......................... 201710213622.6

(51) Int. Cl.
H05K 1/00   (2006.01)
H05K 1/02   (2006.01)
H02H 9/04   (2006.01)

(52) U.S. Cl.
CPC ........... *H05K 1/0259* (2013.01); *H02H 9/046* (2013.01)

(58) Field of Classification Search
CPC ............................. H05K 1/0259; H02H 9/046
(Continued)

(56) References Cited

U.S. PATENT DOCUMENTS 5,536,980 A * 7/1996 Kawate ................. H01H 9/547
                                                          307/116
5,708,549 A * 1/1998 Croft ...................... H02H 9/046
                                                          361/111

(Continued)

FOREIGN PATENT DOCUMENTS

CN   101839931 A    9/2010
CN   102263408 A   11/2011

(Continued)

OTHER PUBLICATIONS

PCT International Search Report, Application No. PCT/CN2018/080449, dated May 23, 2018, 6 pages with English translation.

(Continued)

*Primary Examiner* — Thienvu V Tran
*Assistant Examiner* — Sreeya Sreevatsa
(74) *Attorney, Agent, or Firm* — Armstrong Teasdale LLP

(57) ABSTRACT

The present disclosure provides an electrostatic protection circuit, a circuit board, and an electrostatic protecting method. The electrostatic protection circuit includes a first relay and a second relay, wherein a control terminal of the first relay and a control terminal of the second relay are configured to be connected to a power supply of a system (Continued)

circuit respectively, and wherein the first relay and the second relay are connected in series between the system circuit and a ground terminal to form a charge release path, and the first relay is switched from an open circuit state to a short circuit state when the system circuit is powered off, and the charge release path is in a turn-on state after the first relay is switched to the short circuit state, thereby releasing an electrostatic charge in the system circuit.

14 Claims, 2 Drawing Sheets

(58) Field of Classification Search
USPC .......................................................... 361/212
See application file for complete search history.

(56) References Cited

U.S. PATENT DOCUMENTS

| | | | |
|---|---|---|---|
| 2002/0050961 A1* | 5/2002 | Shirasawa | G09G 3/296 345/60 |
| 2005/0275989 A1* | 12/2005 | Chen | H01L 27/0266 361/93.1 |
| 2008/0192397 A1 | 8/2008 | Liu | |
| 2009/0067106 A1 | 3/2009 | Kim | |
| 2011/0127935 A1* | 6/2011 | Gao | H02M 1/36 318/400.3 |
| 2013/0265676 A1* | 10/2013 | Prabhu | H02H 9/046 361/56 |
| 2015/0229125 A1* | 8/2015 | Kato | H02H 9/046 361/56 |

FOREIGN PATENT DOCUMENTS

| | | |
|---|---|---|
| CN | 102957140 A | 3/2013 |
| CN | 104836217 A | 8/2015 |
| CN | 105848395 A | 8/2016 |
| CN | 106849036 A | 6/2017 |

OTHER PUBLICATIONS

PCT Written Opinion, Application No. PCT/CN2018/080449, dated May 23, 2018, 6 pages: with English translation of relevant part.
China First Office Action, Application No. 201710213622.6, dated Jun. 21, 2018, 15 pps.: with English translation.

* cited by examiner

ELECTROSTATIC PROTECTION CIRCUIT, CIRCUIT BOARD, AND ELECTROSTATIC PROTECTING METHOD

CROSS REFERENCE TO RELATED APPLICATIONS

This patent application is a National Stage Entry of PCT/CN2018/080449 filed on Mar. 26, 2018, which claims the benefit and priority of Chinese Patent Application No. 201710213622.6 filed on Apr. 1, 2017, the disclosures of which are incorporated herein by reference in their entirety as part of the present application.

BACKGROUND

The present disclosure relates to a field of TFT-LCD (Thin Film Transistor-Liquid Crystal Display) technology, and in particular, to an electrostatic protection circuit, a circuit board, and an electrostatic protecting method.

Charge of some electronic energy storage devices such as inductors, capacitors, etc. in a system circuit cannot be released immediately after the system circuit is powered off, resulting in charge accumulation, especially resulting in large charge accumulation for a polar capacitor with larger capacitance value.

BRIEF DESCRIPTION

The present disclosure provides an electrostatic protection circuit, a circuit board, and an electrostatic protecting method.

One aspect of the disclosure provides an electrostatic protection circuit. The electrostatic protection circuit includes a first relay and a second relay. A control terminal of the first relay and a control terminal of the second relay are configured to be connected to a power supply of a system circuit respectively. The first relay and the second relay are connected in series between the system circuit and a ground terminal to form a charge release path.

The first relay is switched from a short circuit state to an open circuit state when the system circuit is powered on and is switched from the open circuit state to the short circuit state when the system circuit is powered off, and the charge release path is in a turn-on state after the first relay is switched to the short circuit state, thereby releasing an electrostatic charge in the system circuit.

The second relay is switched from the open circuit state to the short circuit state when the system circuit is powered on and after the first relay is in the open circuit state for a first time period, and is switched to the open circuit state after being in the short circuit state for a second time period, and the charge release path is in a turn-off state after the second relay is switched to the open circuit state, thereby stopping releasing the electrostatic charge in the system circuit.

The second time period may be a delay time of the second relay, and the first time period may be a difference between the delay time of the second relay and a delay time of the first relay.

The first relay may be a normally-short circuit time relay and the second relay may be a normally-open circuit time relay.

The electrostatic protection circuit may further include a diode connected in series to the system circuit. When the system circuit is powered on, the diode is in a forward conductive state. And when the system circuit is powered off, the diode is in a reverse cut-off state to cause the electrostatic charge in the system circuit to flow into the charge release path.

The electrostatic protection circuit may further include a fuse connected between the charge release path and the ground terminal.

One aspect of the present disclosure provides a circuit board. The circuit board includes a system circuit and the above-described electrostatic protection circuit.

One aspect of the present disclosure provides an electrostatic protecting method applied to the above-described electrostatic protection circuit. The method includes, when the system circuit is powered on, the first relay is switched from the short circuit state to the open circuit state, after the first time period elapses, the second relay is switched from the open circuit state to the short circuit state, when the system circuit is powered off, the first relay is switched from the open circuit state to the short circuit state, such that the charge release path composed of the first relay and the second relay is turned on, thereby the electrostatic charge in the system circuit is released to the ground terminal, and after the second time period elapses, the second relay is switched from the short circuit state to the open circuit state, such that the charge release path is turned off, thereby stopping releasing the electrostatic charge in the system circuit.

The electrostatic protection circuit may further include a diode connected in series to the system circuit. The method further includes, when the system circuit is powered off, the diode is in a reverse cut-off state to cause the electrostatic charge in the system circuit to flow into the charge release path.

The electrostatic protection circuit may further include a fuse connected between the charge release path and the ground terminal. The method further includes, when a current in the charge release path exceeds a set threshold, the fuse blows to protect the relay.

DETAILED DESCRIPTION

The present disclosure will be further described in detail below in conjunction with the drawings and specific embodiments, such that the above-described features and advantages of the present disclosure will become more apparent from the aspects of the appended claims.

Due to charge accumulation, when the system circuit is just powered off, if an object discharges to the system circuit ESD (Electro-Static Discharge) at this time, it is easy to cause electronic oscillation inside the system circuit. When the voltage of the electronic oscillation is too large, this voltage may exceed the reactable voltage of some components, thereby forming a system circuit discharging. Although the energy of the object that is discharged to the system circuit ESD is less, due to the accumulation of a large amount of charge in the system circuit, the large amount of charge is discharged through the harmful channel formed by the ESD, and the discharging energy of the system circuit further exceeds the energy of the ESD, thereby causing damage of the component finally. The most common damage is that the large polarity capacitors are broken down by high current, or some pins are broken down.

An electrostatic protection circuit in accordance with an embodiment of the present disclosure is described in detail below.

Figure 1:
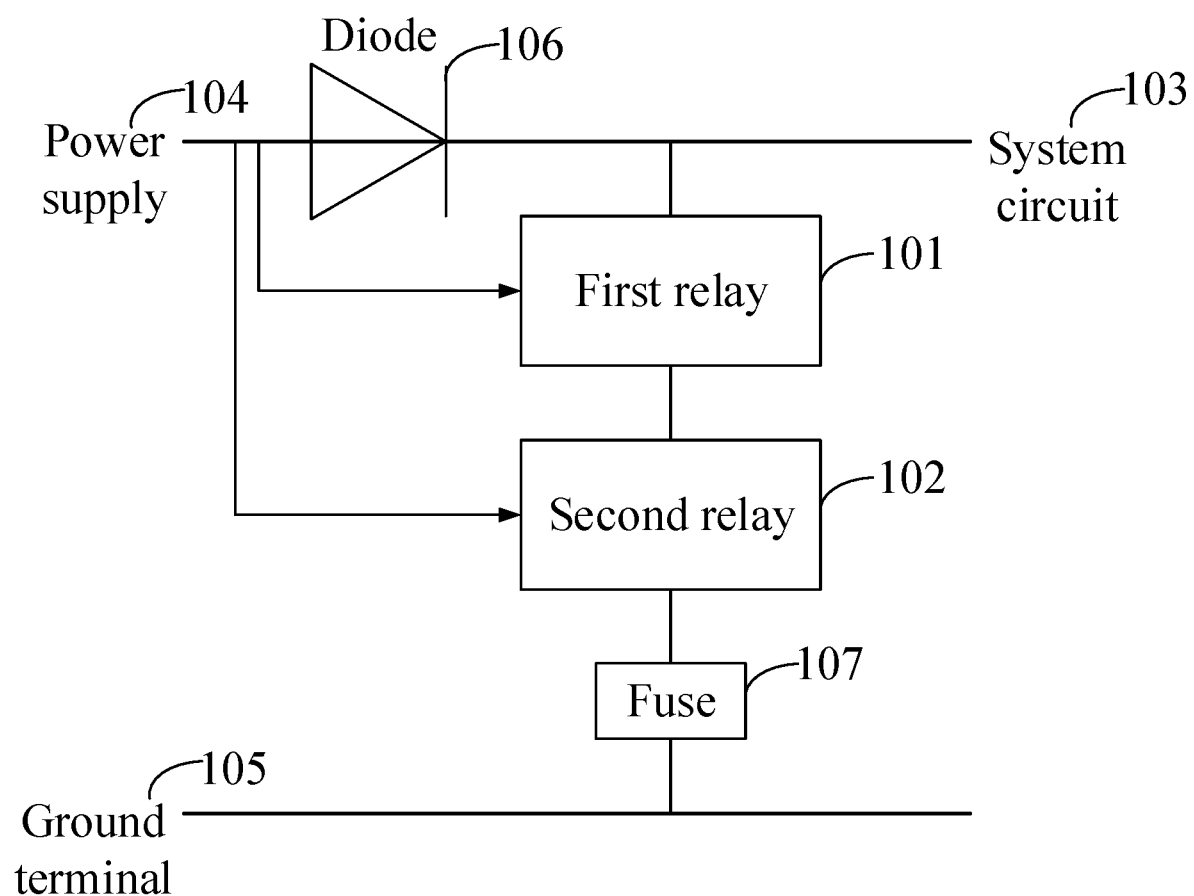
FIG. 1 shows a circuit diagram of an electrostatic protection circuit in accordance with an embodiment of the present disclosure.

FIG. 1 shows an electrostatic protection circuit in accordance with an embodiment of the present disclosure. The electrostatic protection circuit includes a first relay 101 and a second relay 102.

A control terminal of the first relay 101 and a control terminal of the second relay 102 are configured to be connected to a power supply 104 of a system circuit 103, respectively.

The first relay 101 and the second relay 102 are connected in series between the system circuit 103 and a ground terminal 105 to form a charge release path.

The first relay 101 is switched from a short circuit state to an open circuit state when the system circuit 103 is powered on and is switched from the open circuit state to the short circuit state when the system circuit 103 is powered off, and the charge release path is in a turn-on state after the first relay 101 is switched to the short circuit state, thereby releasing an electrostatic charge in the system circuit 103.

The second relay 102 is switched from the open circuit state to the short circuit state when the system circuit 103 is powered on and after the first relay 101 is in the open circuit state for a first time period, and is switched to the open circuit state after being in the short circuit state for a second time period, and the charge release path is in a turn-off state after the second relay 102 is switched to the open circuit state, thereby stopping releasing the electrostatic charge in the system circuit 103.

In an embodiment of the present disclosure, the control terminal of the first relay 101 and the control terminal of the second relay 102 are configured to be connected to the power supply 104 of the system circuit 103, respectively. When the system circuit 103 is powered on, the first relay 101 and the second relay 102 are simultaneously powered on; when the system circuit 103 is powered off, the first relay 101 and the second relay 102 are simultaneously powered off.

The first relay 101 and the second relay 102 are connected in series to form the charge release path. The charge release path is connected between the system circuit 103 and the ground terminal 105. Specifically, the system circuit 103, the first relay 101, the second relay 102, and the ground terminal 105 may be sequentially connected in series, or the system circuit 103, the second relay 102, the first relay 101, and the ground terminal 105 may be sequentially connected in series. Positions of the first relay and the second relay are not specifically limited in the embodiment of the present disclosure, and may be selected according to actual conditions.

When the system circuit 103 is powered on, the first relay 101 is switched from the short circuit state to the open circuit state, and at this time, the charge release path is in the turn-off state. After the first relay 101 is switched to the open circuit state and after the first time period elapses, the second relay 102 is switched from the open circuit state to the short circuit state, and the charge release path is still in the turn-off state.

When the system circuit 103 is powered off, the first relay 101 is switched from the open circuit state to the short circuit state, and at this time, the second relay 102 is also in the short circuit state, thereby the charge release path is in the turn-on state, and the electrostatic charge accumulated in the system circuit 103 can be released to the ground terminal 105 through the charge release path. After the system circuit 103 is powered off, the second relay 102 is switched to the open circuit state after being in the short circuit state for the second time period, and at this time, the charge release path is in the turn-off state, thereby stopping releasing the electrostatic charge in the system circuit 103.

In an exemplary embodiment of the present disclosure, the second time period is a delay time of the second relay 102, and the first time period is a difference between the delay time of the second relay 102 and a delay time of the first relay 101.

In an embodiment of the present disclosure, the delay time of the relay is the time required for the relay to switch state. Specifically, the delay time is the time required when the relay is switched from the short circuit state to the open circuit state, or the time required when the relay is switched from the open circuit state to the short circuit state. The embodiment of the present disclosure does not specifically limit the delay time of the first relay and the delay time of the second relay, and the delay time may be selected according to actual conditions.

In an exemplary embodiment of the disclosure, the first relay is a normally-short circuit time relay and the second relay is a normally-open circuit time relay.

In an embodiment of the present disclosure, a time relay is an automatic switching device that implements delay control using an electromagnetic principle or a mechanical principle. The first relay 101 is the normally-short circuit time relay that is in the short circuit state under a stable state when the system circuit 103 is powered off and is switched from the short circuit state to the open circuit state when the system circuit 103 is powered on and after the delay time. The second time relay 102 is a normally-open circuit time relay that is in the open circuit state under a stable state when the system circuit 103 is powered off and is switched from the open circuit state to the short circuit state when the system circuit 103 is powered on and after the delay time.

In an exemplary embodiment of the present disclosure, the electrostatic protection circuit further includes a diode 106 connected in series to the system circuit 103.

When the system circuit 103 is powered on, the diode 106 is in a forward conductive state, and when the system circuit 103 is powered off, the diode 106 is in a reverse cut-off state to cause the electrostatic charge in the system circuit to flow into the charge release path.

In an exemplary embodiment of the present disclosure, the diode 106 is connected in series to system circuit 103. Specifically, as shown in FIG. 1, a positive electrode of the diode 106 is connected to the power supply 104, and a negative electrode of the diode 106 is connected to the system circuit 103. When the system circuit 103 is powered on, the diode 106 is in a forward conductive, and when the system circuit 103 is powered off, the diode 106 is in a reverse cut-off state. Since the diode 106 is in a reverse cut-off state after the system circuit 103 is powered off, the electrostatic charge in the system circuit 103 can only flow into the charge release path for charge releasing without flowing into the power supply 104.

In an exemplary embodiment of the present disclosure, the electrostatic protection circuit further includes a fuse 107 connected between the charge release path and the ground terminal 105.

In the embodiment of the present disclosure, when the current in the charge release path is too large, the fuse 107 automatically blows to protect the first relay 101 and the second relay 102.

In conclusion, in the embodiment of the present disclosure, the first relay and the second relay in the electrostatic protection circuit constitute a charge release path. When the system circuit is powered off, the charge release path releases the residual charge in the system circuit, so that there is no accumulated charge in the system circuit, thereby better resisting electronic interference such as ESD.

A circuit board in accordance with an embodiment of the present disclosure is described below. The circuit board includes a system circuit and the electrostatic protection circuit as described above.

In the embodiment of the present disclosure, in the electrostatic protection circuit as described above, the first relay 101 and the second relay 102 constitute a charge release path. When the system circuit 103 is powered off, the electrostatic charge in the system circuit 103 can be released to the ground terminal 105 through the charge release path.

In conclusion, in the embodiment of the present disclosure, the circuit board includes an electrostatic protection circuit, and the first relay and the second relay in the electrostatic protection circuit constitute a charge release path. When the system circuit is powered off, the charge release path releases the residual charge in the system circuit, so that there is no accumulated charge in the system circuit, thereby better resisting electronic interference such as ESD.

Figure 2:
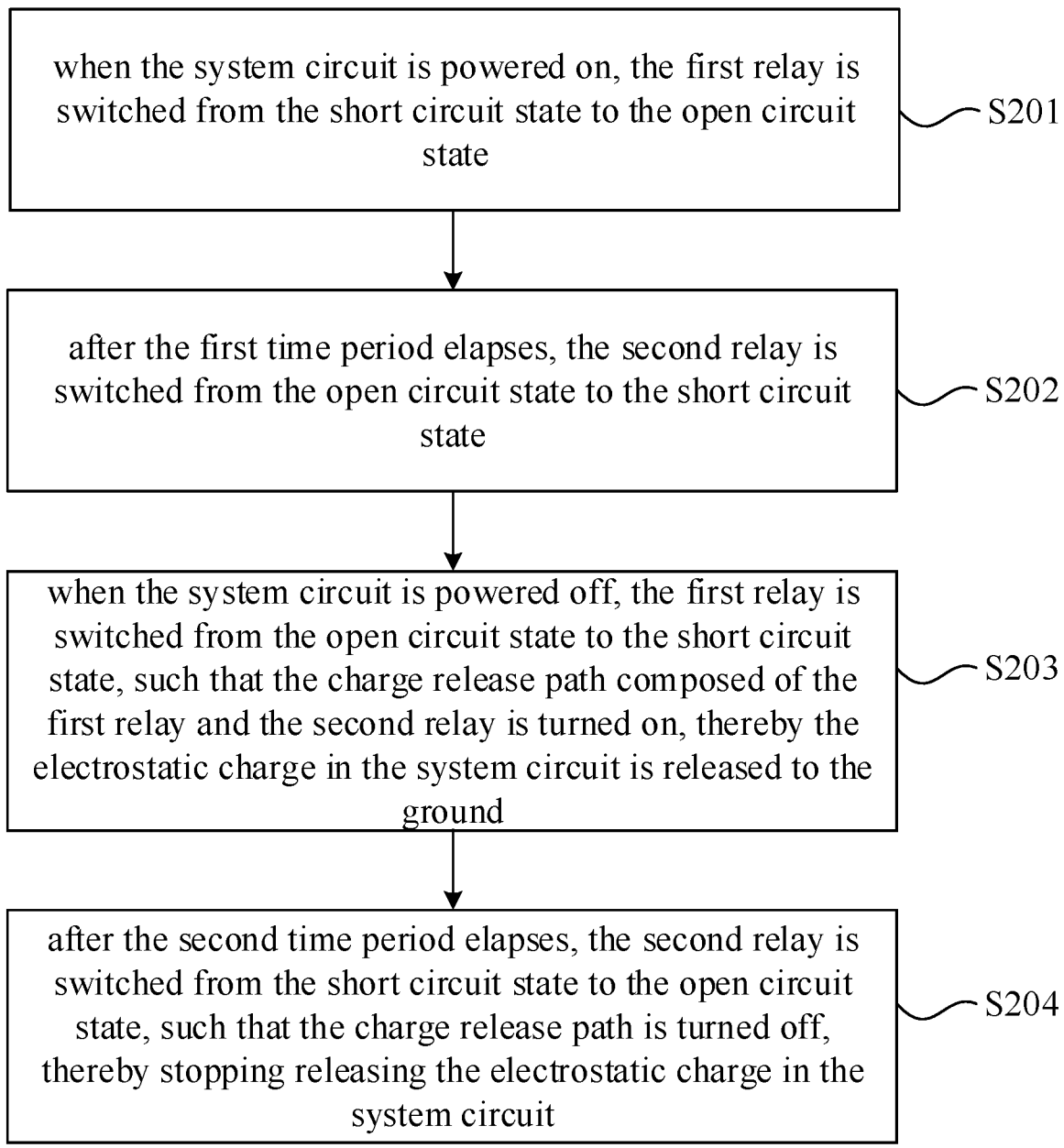
FIG. 2 shows a flow chart of the steps of an electrostatic protecting method in accordance with an embodiment of the present disclosure.

FIG. 2 shows a flow chart of the steps of an electrostatic protecting method in accordance with an embodiment of the present disclosure. This method is applied to the electrostatic protection circuit as described above. The method includes steps S201 to S204.

In step S201, when the system circuit is powered on, the first relay is switched from the short circuit state to the open circuit state.

In an embodiment of the present disclosure, the first relay 101 may employ a normally-short circuit time relay. Before the system circuit 103 is powered on, the first relay 101 is in the short circuit state. When the system circuit 103 is powered on, the first relay 103 is switched from the short circuit state to the open circuit state. At this time, the charge release path composed of the first relay 101 and the second relay 102 is in a turn-off state.

In step S202, after the first time period elapses, the second relay is switched from the open circuit state to the short circuit state.

In an embodiment of the present disclosure, the second relay 102 may employ a normally-open circuit time relay. Before the system circuit 103 is powered on, the second relay 102 is in the open circuit state. When the system circuit 103 is powered on, the first relay 101 is firstly switched from the short circuit state to the open circuit state, and after the first time period elapses, the second relay 102 is switched from the open circuit state to the short circuit state. The time required for the first relay 101 and the second relay 102 to switch states is a delay time of the time relay. The delay time of the first relay 101 is less than the delay time of the second relay 102. The first time period is the difference between the delay time of the second relay 102 and the delay time of the first relay 101. The embodiment of the present disclosure does not specifically limit the first time period, and the first time period may be selected according to actual conditions. Since the first relay is in the open circuit state, the charge release path is still in the turn-off state after the second relay is switched to the short circuit state.

In step S203, when the system circuit is powered off, the first relay is switched from the open circuit state to the short circuit state, so that the charge release path composed of the first relay and the second relay is turned on to release the electrostatic charge in the system circuit to the ground terminal.

In the embodiment of the present disclosure, when the system circuit 103 is powered off, the first relay 101 is switched from the open circuit state to the short circuit state, and the second relay 102 is also in the short circuit state, such that the charge release path composed of the first relay 101 and the second the relay 102 is turned on, thereby the electrostatic charge accumulated in the system circuit 103 is released to the ground terminal 105 through the charge release path.

In an exemplary embodiment of the present disclosure, the electrostatic protection circuit further includes a diode connected in series to the system circuit. When the system circuit is powered off, the diode is in a reverse cut-off state to cause the electrostatic charge in the system circuit to flow into the charge release path.

In an embodiment of the present disclosure, a positive electrode of the diode 106 is connected to the power supply 104 and a negative electrode of the diode 106 is connected to the system circuit 103. When the system circuit 103 is powered on, the diode 106 is in a forward conductive state, when the system circuit 103 is powered off, the diode 106 is in a reverse cut-off state, so that the electrostatic charge accumulated in the system circuit 103 can only flow into the charge release path without flowing into the power supply 104.

In step S204, after the second time period elapses, the second relay is switched from the short circuit state to the open circuit state, so that the charge release path is turned off to stop releasing the electrostatic charge in the system circuit.

In an embodiment of the present disclosure, after the first relay 101 is switched to the short circuit state for the first time period, the second relay 102 is switched from the short circuit state to the open circuit state, so that the charge release path is turned off to stop releasing the electrostatic charge in the system circuit 103.

In an exemplary embodiment of the present disclosure, the electrostatic protection circuit further includes a fuse connected between the charge release path and the ground terminal. The fuse blows when the current in the charge release path exceeds a set threshold to protect the relay.

In an embodiment of the present disclosure, the fuse 107 is connected between the charge release path and the ground terminal 105. When the current in the charge release path is too large to exceed the set threshold, the fuse 107 blows, and the charge release path is turned off, thereby stopping releasing the electrostatic charge in the system circuit 103, thus protecting the first relay 101 and the second relay 102. The fuse selected and the set threshold of current is not specifically limited in the embodiment of the present disclosure, and may be selected according to actual conditions.

In conclusion, in the embodiment of the present disclosure, the first relay and the second relay in the electrostatic protection circuit constitute a charge release path. When the system circuit is powered off, the charge release path releases the residual charge in the system circuit, so that there is no accumulated charge in the system circuit, thereby better resisting electronic interference such as ESD. Further, the electrostatic protection circuit further includes a diode and a fuse. The diode is in a reverse cut-off state when the system circuit is powered off, causing the electrostatic charge to flow into the charge release path. The fuse blows when the current in the charge release path is too large to protect the relay.

For the foregoing method embodiments, for the sake of brevity, the embodiments are all described as a series of combinations of actions, but those skilled in the art should understand that the present disclosure is not limited by the described order of actions, because according to the present disclosure, some steps can be performed in other orders or at the same time. Then, those skilled in the art should also understand that the embodiments described in the specification are all exemplary embodiments, and the actions and modules involved are not necessarily required by the present disclosure.

The various embodiments in the present specification are described in a progressive manner, and each embodiment focuses on differences from other embodiments, and the same similar parts between the various embodiments can be referred to each other.

Finally, it should also be noted that, in this context, relational terms such as first and second are used merely to distinguish one entity or operation from another entity or operation, and do not necessarily require or imply that there is any such actual relationship or order between these entities or operations. Furthermore, the terms "comprise", "include" or any other variation thereof intend to cover non-exclusive inclusions, such that the processes, methods, commodities, or equipments that include a series of elements include not only those elements, but also other elements not explicitly listed, or further include elements that are inherent to such processes, methods, commodities, or equipments. The element that is defined by the phrase "comprising a . . . " does not exclude the presence of additional same elements in the processes, methods, commodities, or equipments that include the element.

The electrostatic protection circuit, the circuit board, and the electrostatic protecting method provided by the present disclosure are described in detail above. The specific examples are used herein to explain the principles and embodiments of the present disclosure. The description of the above embodiments is only used to help understand the method of the present disclosure and its core idea; at the same time, for those skilled in the art, there will be changes in the specific embodiment and the scope of application according to the idea of the present disclosure. In conclusion, the content of the specification should not be understood as a limit to the disclosure.

What is claimed is:

1. An electrostatic protection circuit comprising a first relay and a second relay,
    wherein a control terminal of the first relay and a control terminal of the second relay are configured to be connected to a power supply of a system circuit respectively;
    wherein the first relay and the second relay are connected in series between the system circuit and a ground terminal to form a charge release path, wherein the first relay is switched from a short circuit state to an open circuit state when the system circuit is powered on and is switched from the open circuit state to the short circuit state when the system circuit is powered off, and wherein the charge release path is in a turn-on state after the first relay is switched to the short circuit state, thereby releasing an electrostatic charge in the system circuit; and
    wherein the second relay is switched from the open circuit state to the short circuit state when the system circuit is powered on and after the first relay is in the open circuit state for a first time period, and when the system circuit is powered off and after the second relay is in the short circuit state for a second time period, the second relay is switched to the open circuit state, and wherein the charge release path is in a turn-off state after the second relay is switched to the open circuit state, thereby stopping the release of the electrostatic charge in the system circuit,
    wherein the second time period is a delay time of the second relay, and wherein the first time period is a difference between the delay time of the second relay and a delay time of the first relay.

2. The electrostatic protection circuit according to claim 1, wherein the first relay is a normally-short circuit time relay and the second relay is a normally-open circuit time relay.

3. The electrostatic protection circuit according to claim 1, further comprising a diode connected in series between the power supply and the system circuit,
    wherein when the system circuit is powered on, the diode is in a forward conductive state, and when the system circuit is powered off, the diode is in a reverse cut-off state to cause the electrostatic charge in the system circuit to flow into the charge release path.

4. The electrostatic protection circuit according to claim 1, further comprising a fuse connected between the charge release path and the ground terminal.

5. A circuit board comprising the system circuit and the electrostatic protection circuit according to claim 1.

6. An electrostatic protecting method applied to the electrostatic protection circuit according to claim 1, the method comprising:
    when the system circuit is powered on, switching the first relay from the short circuit state to the open circuit state;
    after the first time period elapses, switching the second relay from the open circuit state to the short circuit state;
    when the system circuit is powered off, switching the first relay from the open circuit state to the short circuit state, such that the charge release path composed of the first relay and the second relay is turned on, thereby the electrostatic charge in the system circuit is released to the ground terminal; and
    after the second time period elapses, switching the second relay from the short circuit state to the open circuit state, such that the charge release path is turned off, thereby stopping the release of the electrostatic charge in the system circuit.

7. The method according to claim 6, wherein the electrostatic protection circuit further comprises a diode connected in series between the power supply and the system circuit, the method further comprising:
    when the system circuit is powered off, putting the diode in a reverse cut-off state to cause the electrostatic charge in the system circuit to flow into the charge release path.

8. The method according to claim 6, wherein the electrostatic protection circuit further comprises a fuse connected between the charge release path and the ground terminal, the method further comprising:
    when a current in the charge release path exceeds a set threshold, blowing the fuse to protect the relay.

9. A circuit board comprising the system circuit and the electrostatic protection circuit according to claim 2.

10. A circuit board comprising the system circuit and the electrostatic protection circuit according to claim 3.

11. A circuit board comprising the system circuit and the electrostatic protection circuit according to claim 4.

12. An electrostatic protecting method applied to the electrostatic protection circuit according to claim 2, the method comprising:
- when the system circuit is powered on, switching the first relay from the short circuit state to the open circuit state;
- after the first time period elapses, switching the second relay from the open circuit state to the short circuit state;
- when the system circuit is powered off, switching the first relay from the open circuit state to the short circuit state, such that the charge release path composed of the first relay and the second relay is turned on, thereby the electrostatic charge in the system circuit is released to the ground terminal; and
- after the second time period elapses, switching the second relay from the short circuit state to the open circuit state, such that the charge release path is turned off, thereby stopping releasing the electrostatic charge in the system circuit.

13. An electrostatic protecting method applied to the electrostatic protection circuit according to claim 3, the method comprising:
- when the system circuit is powered on, switching the first relay from the short circuit state to the open circuit state;
- after the first time period elapses, switching the second relay from the open circuit state to the short circuit state;
- when the system circuit is powered off, switching the first relay from the open circuit state to the short circuit state, such that the charge release path composed of the first relay and the second relay is turned on, thereby the electrostatic charge in the system circuit is released to the ground terminal; and
- after the second time period elapses, switching the second relay from the short circuit state to the open circuit state, such that the charge release path is turned off, thereby stopping releasing the electrostatic charge in the system circuit.

14. An electrostatic protecting method applied to the electrostatic protection circuit according to claim 4, the method comprising:
- when the system circuit is powered on, switching the first relay from the short circuit state to the open circuit state;
- after the first time period elapses, switching the second relay from the open circuit state to the short circuit state;
- when the system circuit is powered off, switching the first relay from the open circuit state to the short circuit state, such that the charge release path composed of the first relay and the second relay is turned on, thereby the electrostatic charge in the system circuit is released to the ground terminal; and
- after the second time period elapses, switching the second relay from the short circuit state to the open circuit state, such that the charge release path is turned off, thereby stopping releasing the electrostatic charge in the system circuit.

\* \* \* \* \*